US006602540B2

United States Patent
Gu et al.

(10) Patent No.: US 6,602,540 B2
(45) Date of Patent: *Aug. 5, 2003

(54) FABRICATION OF NON-POLYMERIC FLEXIBLE ORGANIC LIGHT EMITTING DEVICES

(75) Inventors: Gong Gu, Princeton, NJ (US); Paul Burrows, Princeton, NJ (US); Stephen R. Forrest, Princeton, NJ (US)

(73) Assignee: The Trustees of Princeton University, Princeton, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/957,909

(22) Filed: Oct. 27, 1997

(65) Prior Publication Data

US 2002/0058103 A1 May 16, 2002

Related U.S. Application Data

(62) Division of application No. 08/789,319, filed on Jan. 23, 1997, now Pat. No. 5,844,363.
(60) Provisional application No. 60/024,001, filed on Aug. 12, 1996, now abandoned.

(51) Int. Cl.[7] .............................. B05D 5/12; B05D 5/06; B05D 5/00
(52) U.S. Cl. ............................. 427/66; 427/69; 427/70; 313/504
(58) Field of Search ........................... 427/69, 70, 255, 427/248.1, 77, 164, 66, 64, 68, 226, 343, 126.1, 126.3, 126.5; 313/504

(56) References Cited

U.S. PATENT DOCUMENTS

| 4,020,389 A | 4/1977 | Dickson et al. .............. 315/246 |
| 4,786,570 A | 11/1988 | Yu et al. ........................ 430/58 |
| 4,943,508 A | 7/1990 | Yu .............................. 430/126 |

(List continued on next page.)

FOREIGN PATENT DOCUMENTS

| JP | 7-78690 | 3/1995 |

OTHER PUBLICATIONS

G. Gustafsson et al., The Plastic LED: A Flexible Light--Emitting Device Using a Polyaniline Transparent Electrode, Synthetic Metals, 55–57, 4123–4227 (1993) (no mo).

Y. Zhang & S.R. Forrest, "Mechanism of Quasiepitaxial Ordering at Organic Molecular Thin Film Interfaces", Phys. Rev. Lett. 71, 2765 (1993). (no mo).

C. Kittel, "Introduction to Solid State Physics", Solid State Physics 4th ed. (Wiley, NY 1971) 143. (no mo).

P. E. Burrows, et al., Gas Permeation and Lifetime Tests on Polymer–Based Barrier Coatings, Proceedings of SPIE, vol. 4105, 2001, pp. 75–83.

(List continued on next page.)

Primary Examiner—Michael Barr
Assistant Examiner—Michael Cleveland
(74) Attorney, Agent, or Firm—Kenyon & Kenyon (57) ABSTRACT

An organic light emitting device (OLED) is disclosed for which the hole transporting layer, the electron transporting layer and/or the emissive layer, if separately present, is comprised of a non-polymeric material. A method for preparing such OLED's using vacuum deposition techniques is further disclosed.

17 Claims, 5 Drawing Sheets

U.S. PATENT DOCUMENTS

| | | | |
|---|---|---|---|
| 5,331,182 A | * | 7/1994 | Takimoto et al. ............ 257/40 |
| 5,364,654 A | * | 11/1994 | Hosokawa et al. ........... 427/70 |
| 5,389,444 A | * | 2/1995 | Hosokawa et al. ......... 428/457 |
| 5,530,269 A | | 6/1996 | Tang |
| 5,554,220 A | | 9/1996 | Forrest et al. ............... 117/88 |
| 5,558,904 A | * | 9/1996 | Hsieh et al. .................. 427/66 |
| 5,597,890 A | * | 1/1997 | Jenekhe ..................... 528/377 |
| 5,652,067 A | * | 7/1997 | Ito et al. .................... 428/690 |
| 5,670,212 A | | 9/1997 | Staring et al. |
| 5,705,284 A | * | 1/1998 | Hosokawa et al. ........... 427/70 |
| 5,705,888 A | * | 1/1998 | Staring et al. .............. 313/503 |
| 5,714,838 A | * | 2/1998 | Haight et al. .............. 313/506 |
| 5,719,467 A | * | 2/1998 | Antoniadis et al. ......... 313/506 |
| 6,013,982 A | | 1/2000 | Thompson et al. |

OTHER PUBLICATIONS

Brochure of "Southwall Altair O Transparent Conductive Film", Dec. 1995, 2 pages, Southwall Technologies, Inc., Palo Alto. CA.

Fujita, et al., "Surface Treatment of Indium–Tin–Oxide Substrates and Its Effects on Initial Nucleation Processes of Diamine Films", Jpn, J. Appl. Phys,. vol. 36 (1997), pp.. 350–353, Part 1, No. 1A, Jan. 1997.

* cited by examiner

FABRICATION OF NON-POLYMERIC FLEXIBLE ORGANIC LIGHT EMITTING DEVICES

This application is a division of application Ser. No. 08/789,319, filed on Jan. 23, 1997, now U.S. Pat. No. 5,844,363, and claims priority to provisional application 60/024,001, filed Aug. 12, 1996, now abandoned.

FIELD OF THE INVENTION

The subject invention is directed to flexible organic light emitting devices (OLED's) including a hole transporting layer and/or an electron transporting layer comprised of a vacuum-deposited, non-polymeric material.

BACKGROUND OF THE INVENTION

In one type of electrically controlled light emitting device, organic material is placed between a layer of conductive material that can inject electrons and a layer of conductive material that can inject holes. When a voltage of proper polarity is applied between the outer layers of conductive material, electrons from one layer combine with holes from the other so as to release energy as light that is, to produce electroluminescence (EL). These devices are referred to as organic light emitting devices, OLED's.

OLED's have been constructed from polymers so as to have a highly advantageous flexibility that enables them to be used for light weight, portable, roll-up displays or to be used for conformable displays which can be readily attached to windows, windshields or instrument panels that may have curved surfaces; "The Plastic LED: A Flexible Light-Emitting Device Using a Polyaniline Transparent Electrode" by G. Gustafsson et al in "Synthetic Metals", 55–57 4123–4227 (1993). Even though there is a widespread application of vacuum-deposited, small-molecule-based heterostructural OLED's, which have been constructed on inflexible glass substrates and use ITO as the hole emitting layer, the devices of Gustafsson were fabricated using a polymer, that is, soluble semiconducting polymer poly(2-methoxy,5-(2'-ethyl-hexoxy)-1,4-phenylene-vinylene) (MEH-PPV) as the emissive layer, since the mechanical properties of polymers were deemed to be unique with respect to making such devices.

It would be desirable if flexible OLED's could be fabricated having improved electroluminescent properties as well as the advantage of being readily fabricated using the vacuum deposition techniques typically used for preparing OLED's.

SUMMARY OF THE INVENTION

In accordance with this invention, a flexible OLED using small molecule based heterostructure of organic material is provided in which the hole transporting layer, the electron transporting layer, and/or the emissive layer, if separately present, includes a non-polymeric material, that is, a layer comprised of small molecules.

The term "small molecules" is used herein to refer to molecules which are small in the sense that such molecules are not made up of a plurality of repeating molecular units such as are present in a polymeric material. Thus, for purposes of this invention, the term "small molecule" is intended to be used interchangeably with the term "non-polymeric." In fact, the term "small molecules" may embrace relatively large molecules such as are typically used in the hole transporting layer, the electron transporting layer and/or the emissive layer that is present in an OLED.

The subject invention is further directed to a method of fabricating flexible OLED's wherein the hole transporting layer, the electron transporting layer and/or the emissive layer, if present, may be prepared using vacuum deposition techniques, rather than using the less convenient fabrication technique such as employed by Gustafsson et al, that is, rather than spin coating a layer of polymer, such as polyaniline onto the flexible substrate. Such vacuum deposition methods are particularly suitable for use in fabricating the OLED's of the subject invention since the other layers of the OLED are also typically prepared using vacuum deposition techniques. Integration of all the vacuum deposition steps into a single overall sequence of steps for fabricating the OLED, without requiring the use of solvents or removing the air sensitive layers from a vacuum chamber and exposing them to ambient conditions provides an additional especially beneficial advantage. Thus, the subject invention is directed to a method, wherein the hole transporting, electron transporting, and/or separate emissive layer, if present, may be prepared using vacuum deposition steps.

DETAILED DESCRIPTION OF PREFERRED EMBODIMENTS

The subject invention will now be described in detail for specific preferred embodiments of the invention, it being understood that these embodiments are intended only as illustrative examples and the invention is not to be limited thereto.

As illustrative embodiments of the subject invention, the subject OLED's may be incorporated into a single heterostructure or in a double heterostructure. The materials, methods and apparatus for preparing the single and double heterostructures are disclosed, for example, in U.S. Pat. No. 5,554,220, which is herein incorporated in its entirety by reference. The subject invention as disclosed herein may be used in conjunction with co-pending applications, "High Reliability, High Efficiency, Integratable Organic Light Emitting Devices and Methods of Producing Same;" "Novel Materials for Multicolor LED's;" "Electron Transporting and Light Emitting Layers Based on Organic Free Radicals;" "Multicolor Display Devices;" "Red-Emitting Organic Light Emitting Devices (LED's);" and "High Efficiency Organic Light Emitting Device Structures;" each of said co-pending application being filed on Dec. 23, 1996, and being herein incorporated in their entirety by reference. The subject invention may also be used in conjunction with co-pending U.S. Ser. No. 08/354,674, filed Dec. 13, 1994, now U.S. Pat. No. 5,707,745; Ser. No. 08/613,207, filed Mar. 6, 1994 now U.S. Pat. No. 5,703,436; Ser. No. 08/632,316, filed Apr. 15, 1996, now U.S. Pat. No. 5,721,160; Ser. No. 08/632,322, filed Apr. 15, 1996, now U.S. Pat. No. 5,757,026; Ser. No. 08/693,359, filed Aug. 6, 1996, now U.S. Pat. No. 6,358,631; which are also herein incorporated in their entirety by reference.

The single or double heterostructures, as referred to herein, are intended solely as examples showing how-an OLED embodying the subject invention may be fabricated without in any way intending the invention to be limited to the particular sequence or order of making the layers shown. For example, a single heterostructual OLED of the subject invention includes a flexible substrate, which is preferably transparent; a first electrode, which may typically be an indium tin oxide (ITO) anode layer; a hole transporting layer; an electron transporting layer; a second electrode layer, for example, a metal cathode layer of Mg:Ag; and a metal protective layer, for example, made of a layer of Ag, for protecting the Mg:Ag cathode layer from atmospheric oxidation. A double heterostructure would also include an additional layer containing an emissive material. This additional layer is herein referred to as a "separate emissive layer" so as to distinguish it from the other layers, since the hole transporting layer and the electron transporting layer can be made to produce electroluminescent emission without the need for this separate emissive layer.

Although not limited to the thickness ranges recited herein, the ITO anode layer may be about 1000 Å (1 Å=$10^{-8}$ cm) to greater than about 4000 Å thick; the hole transporting layer about 50 Å to greater than about 1000 Å thick; the layer containing emissive material about 50 Å to about 200 Å thick; the electron transporting layer about 50 Å to about 1000 Å thick; and each metal layer, about 50 Å to greater than about 100 Å thick, or substantially thicker if the cathode layer is not intended to be transparent.

The ability to achieve highly flexible displays vacuum-deposited molecular organic materials, which have stable electroluminescent properties, depends on, inter alia, the following two factors. First, the molecular bonds responsible for the mechanical properties of the thin films comprising the OLED needs to be reasonably tolerant of the stress applied to the structure on bending, and, second, the substrates needs to be sufficiently flat and uniform such that mechanical defects are not formed during growth or flexing.

Concerning the first factor, virtually all organic materials used in vacuum-deposited OLED's are held together by highly flexible van der Waals bonds. Previously, it has been shown, Y. Zhang and S. R. Forrest, Phys. Rev. Lett. 71, 2765 (1993), that the bonding of aromatic molecules similar to those used in OLED's is highly compressible. For example, it was shown that the compressibility of the van der Waals-bonded naphthalene-based molecular crystal NTCDA has a roughly 20-times-higher compressibility than most ductile metals such as In or Al. C. Kittel, Solid State Physics, 4th ed. (Wiley, New York, 1971) p. 143. While not intending to be limited to the theory of why the subject invention is capable of producing stable electroluminescence, such considerations help to explain why the molecular materials disclosed herein are sufficiently ductile to undergo significant stress without cracking.

Figure 4A:
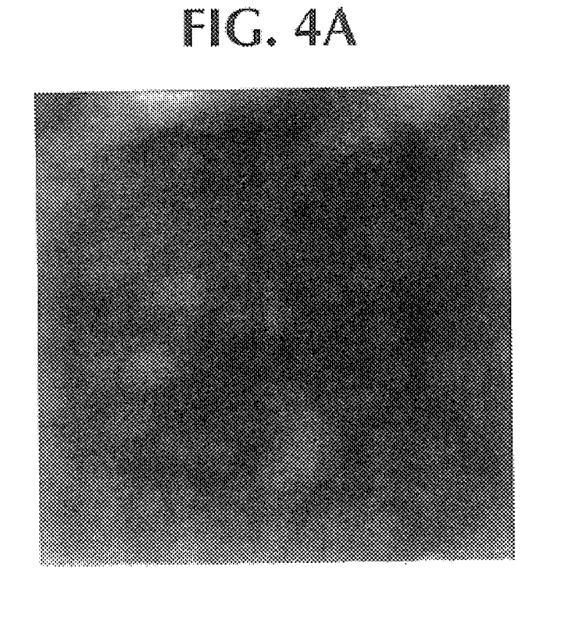
FIG. 4 shows atomic force microscope (AFM) images of a typical ITO-coated polyester substrate film wherein (a) shows the ITO (top) substrate and (b) shows the polyester (bottom) substrate surface. The height range of the images was ~50 nm (nanometers).
Figure 4B:
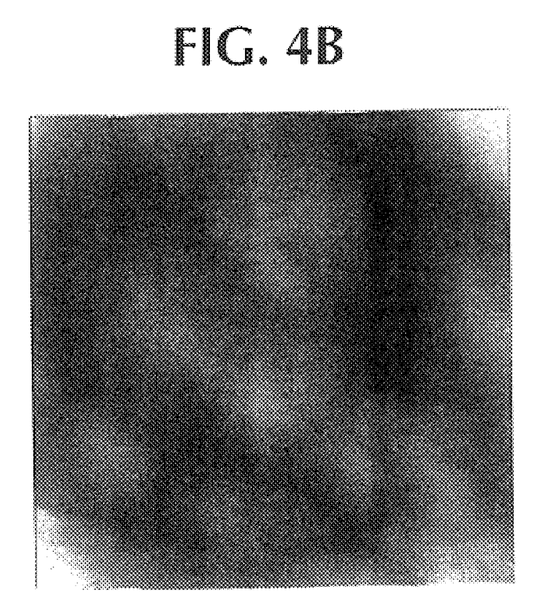

The second factor, that the substrates used be sufficiently flat, was established through the use of images produced by an atomic force microscope. These images, such as shown in FIG. 4, shows that the ITO surface had a rms roughness of only 1.8 nm, whereas the polyester surface of the flexible was somewhat rougher, with a rms value of 2.8 nm. Although there was some variation from substrate to substrate, ITO surface roughness did not exceed 3.6 nm. In either case, the substrates were sufficiently smooth (i.e., the height of the surface features was a small fraction of the total device thickness) such that no significant damage was observed for the subject OLED heterostructure on growth or bending.

Based on such considerations, the subject devices grown on flexible substrates were found to have efficiencies comparable with conventional vacuum-deposited OLED's grown on glass and, furthermore, such devices were found to be mechanically robust.

This invention will now be described in detail with respect to showing how certain specific representative embodiments thereof will be made, the materials, apparatus and process steps being understood as examples that are intended to be illustrative only. In particular, the invention is not intended to be limited to the methods, materials, conditions, process parameters, apparatus and the like specifically recited herein.

EXAMPLES

Figure 1:
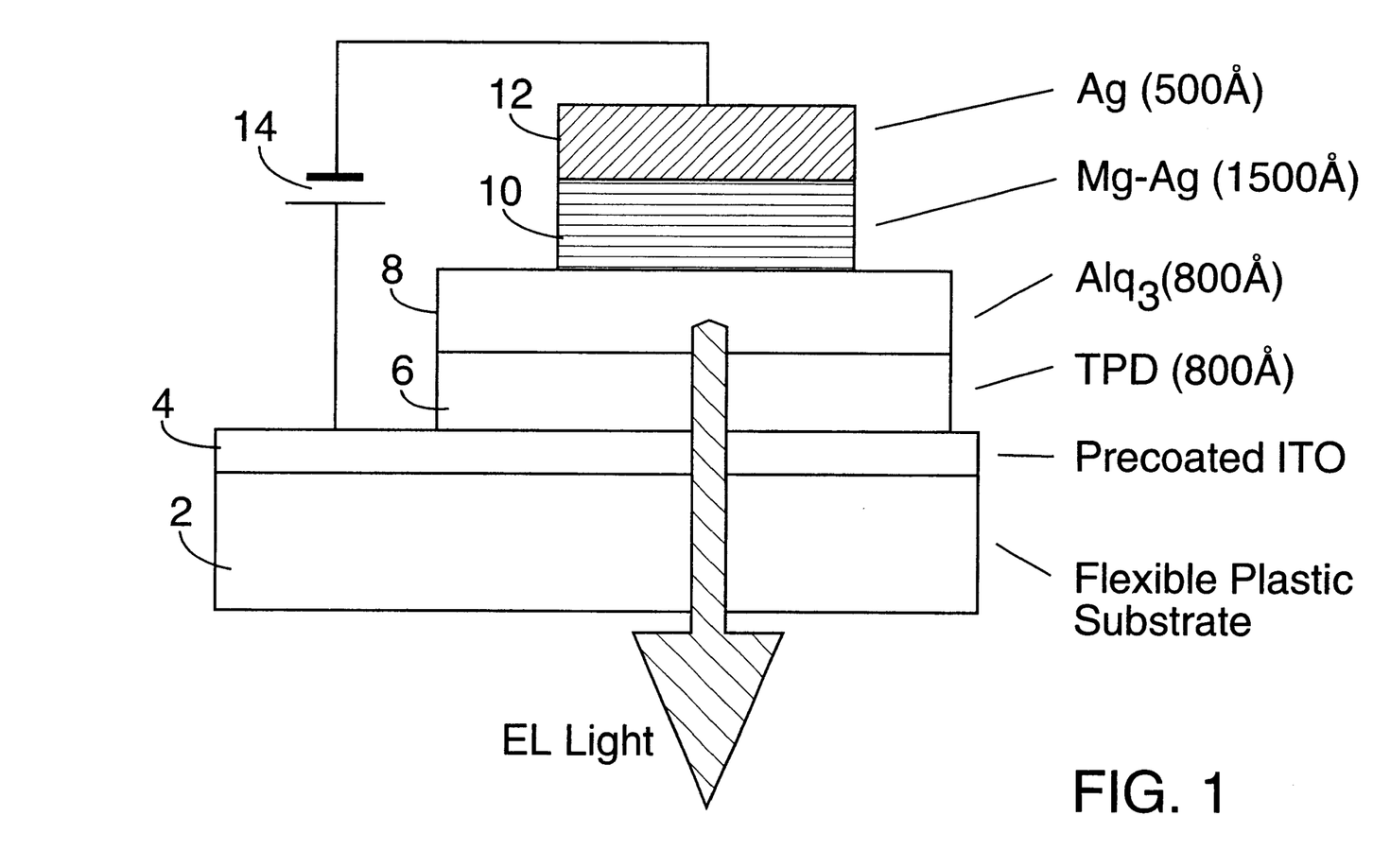
FIG. 1 is a cross section of one embodiment of a flexible OLED constructed in accordance with this invention.

In the cross section of the particular embodiment of the invention illustrated in FIG. 1, a flexible substrate 2 for the device is comprised of any suitable flexible polymer sheet such as a polyester. Preferably, the flexible substrate is capable of being bent to a radius of curvature down to 0.5 cm or less. The flexible substrate 2 is precoated with a thin film 4 of indium tin oxide, ITO, such as is available from Southwall Technologies, Inc., 1029 Corporation Way, Palo Alto, Calif., 94303, Part No. 903-6011. In this particular embodiment, the hole transport layer 6 was comprised of N,N'-diphenyl-N,N'-bis(3-methylpheny)1-1'biphenyl-4,4'diamine (TPD), and the electron transporting layer 8 was comprised of tris-(8-hydroxyquinoline) aluminum($Alq_3$). Other non-polymeric materials, such as known in the art for preparing hole transporting layers, electron transporting layers and emissive layers may also be used. The hole conducting layer 6 of TPD is formed on top of the hole injecting ITO layer 4, and a light emitting layer 8 of $Alq_3$ is formed on the layer 6. Alternatively, a single layer can be used in place of the layers 6 and 8 in which TPD and $Alq_3$ are combined. A layer 10 of Mg—Ag is formed on the $Alq_3$ layer 8, and a layer 12 of Ag is formed on the Mg—Ag layer 10. A power supply 14 is connected between the Ag layer 12 and the precoated ITO layer 4.

Although the layers could have different thicknesses than those shown in the table below, the thicknesses shown produced the characteristics illustrated by the graphs of FIGS. 2 and 3.

| Layer No. | Layer Thickness |
|---|---|
| layer 2 | 175 μM |
| layer 6 | 800 Å |
| layer 8 | 800 Å |
| layer 10 | 1500 Å |
| layer 12 | 500 Å |

In accordance with another aspect of the invention, the light emitting device of FIG. 1 may be fabricated as follows.

In this example, the substrate 2 is a 175 μM thick (1 μM=10⁻⁶ meters) transparent polyester sheet precoated with a transparent, conducting ITO thin film 4. The thickness of the flexible substrate may be either substantially thicker or thinner depending on the needs of the particular application which the OLED is used. The sheet resistance of the ITO thin film 4 was 60 Ω/□, and the transparency of the coated substrate was ~80% throughout the visible spectrum. Prior to the deposition of the organic film, the substrate 2 was ultrasonically cleaned in detergent for two minutes, then rinsed with deionized water. Next, it was rinsed in 2-propanol, held at room temperature for two to three minutes, and then boiled in 2-propanol again for two to three minutes, followed by drying with a blow gun using a stream of filtered dry nitrogen. An 800 Å thick layer 6 of the hole conducting material, TPD, was deposited by thermal evaporation in a vacuum of $<4\times10^{-7}$ Torr, followed by the deposition of a 800 Å thick $Alq_3$ layer. The top electrode consisted of a 1500 Å thick layer of Mg—Ag and a 500 Å thick Ag cap deposited through a shadow mask. A conventional device on an ITO-precoated glass substrate was simultaneously fabricated for comparison using identical cleaning and deposition procedures. The sheet resistance and transparency of the ITO-precoated glass substrate was 20 Ω/□ and ~90%, respectively.

Figure 2:
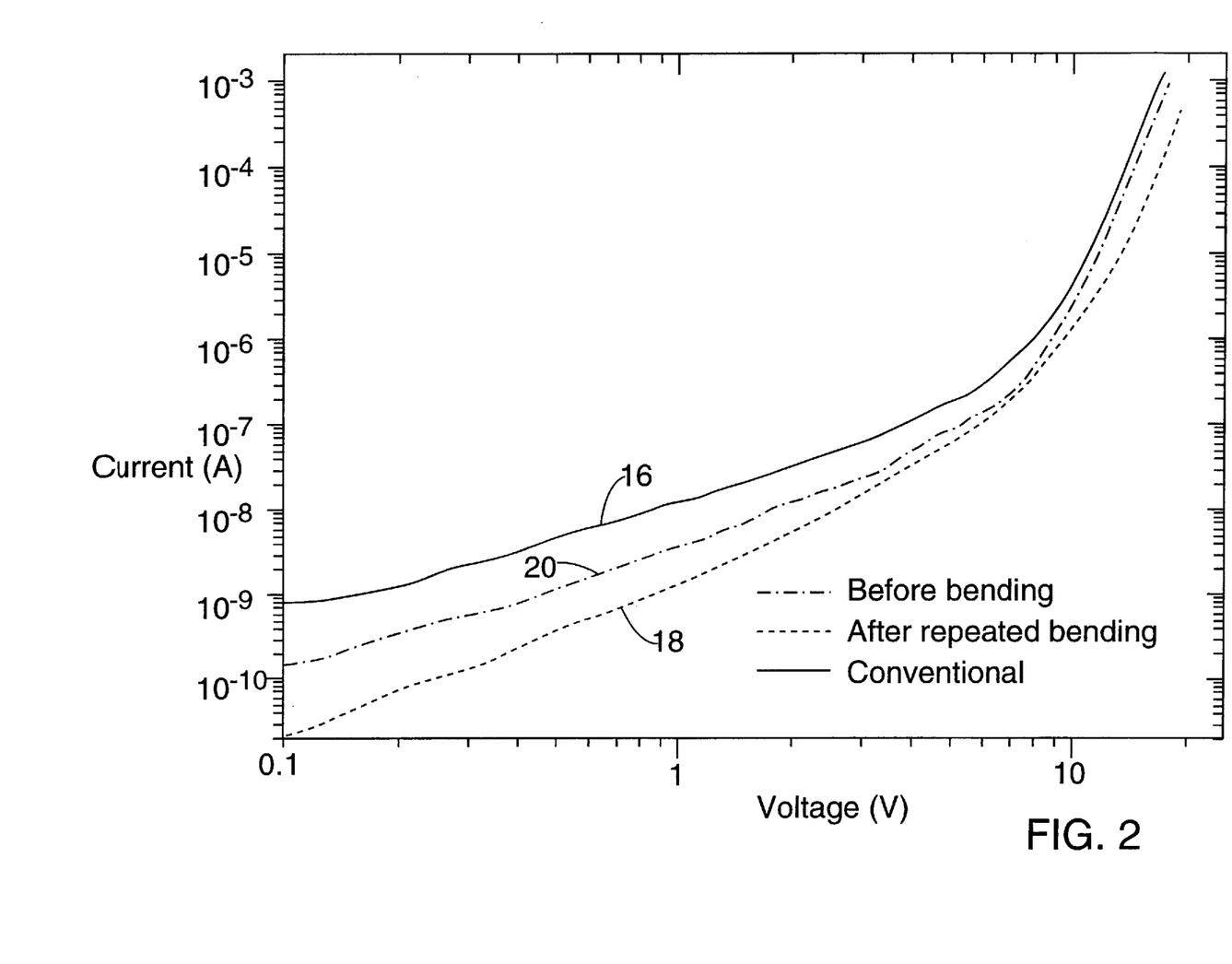
FIG. 2 contains graphs illustrating the current vs. voltage characteristic of an OLED such as shown in FIG. 1 before and after repeated bending and the current vs. voltage characteristic of a prior art OLED having a glass substrate in place of the flexible polyester substrate.

FIG. 2 shows the current-voltage characteristics of a 1 mm diameter flexible device prior to bending, curve 16, after repeated bending (4 to 5 times) over a small radius of curvature (~0.5 cm), curve 18, and the conventional device on a glass substrate, curve 20. All the current/voltage curves are shown to follow the power law dependence of current-on-voltage. At lower voltages, the current/voltage curves indicate ohmic behavior; while at higher voltages, the curves follow $I=V^{m+1}$ with m=7, suggestive of trap-limited conduction typical of OLED's. The power law dependence was observed for at least four orders of magnitude change in current in the high current region. There was no obvious change in the current/voltage characteristics after the device was repeatedly flexed. The turn-on voltages (defined as the voltages at which the current due to ohmic and trap limited conduction are equal) of the three curves was almost identical (~6.5V), while the leakage current at low voltages of the flexible device was even less than that of the conventional device, and was not increased after bending. This indicated that the ITO film precoated on the flexible substrate is sufficiently uniform such that current shunt paths between the top and bottom contacts 12 and 4 are not induced after bending, even for very thin film (~1600 Å molecular organic structures).

Figure 3:
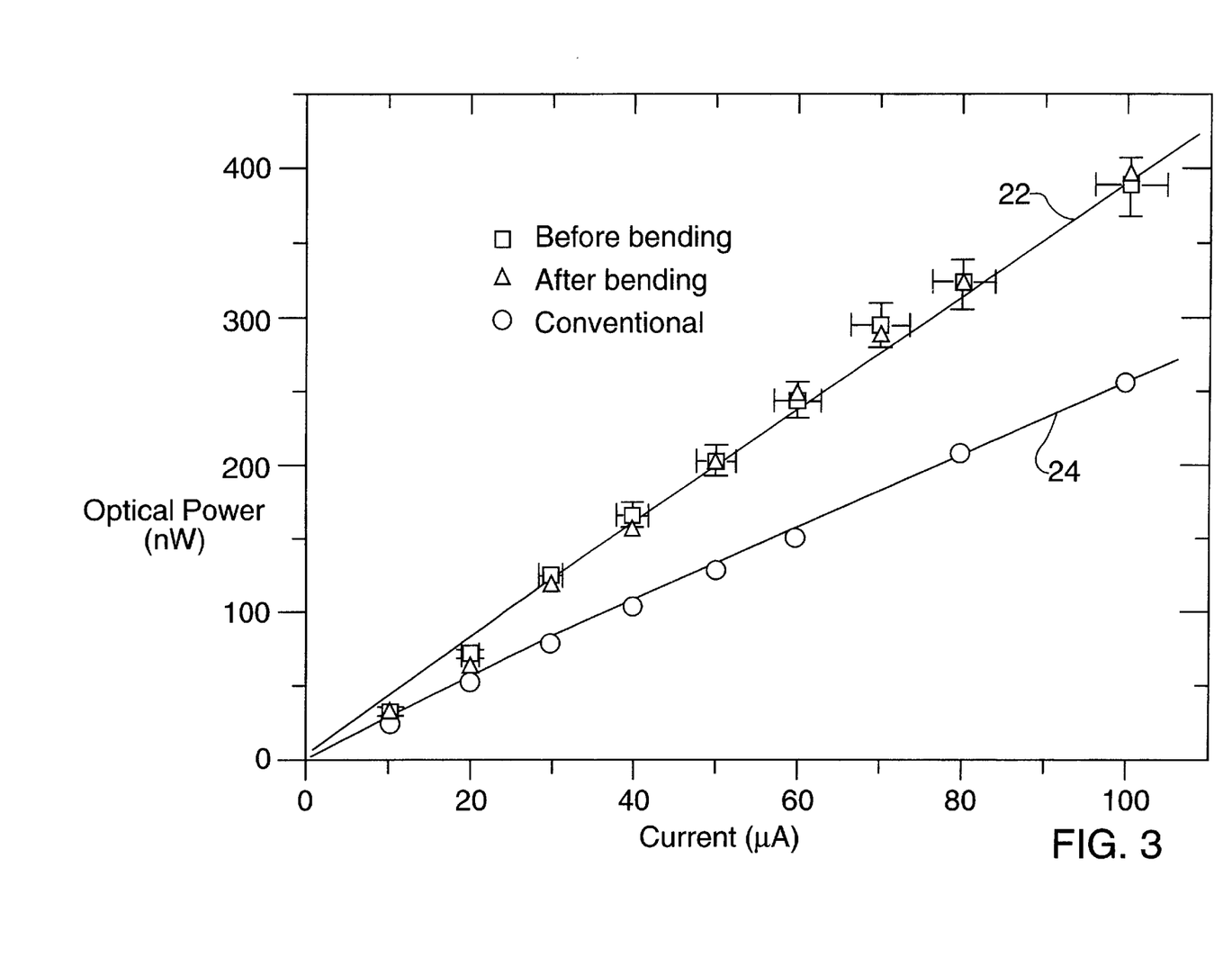
FIG. 3 contains graphs illustrating the optical power vs. current characteristics of an OLED such as shown in FIG. 1 before and after repeated bending and the current vs. voltage characteristic of a prior art OLED used in a glass substrate in place of the flexible polyester substrate.

The light output power versus current (L-I) characteristics of the flexible-device before and after bending, and of the conventional device are shown in FIG. 3 by graph 22. Curve 24 illustrates the L-I output of a standard device having a glass substrate. The external quantum efficiency of the flexible device was 0.20%, and that of the conventional device was 0.14%. In both cases, the efficiency was calculated from light emitted only in the forward scattering direction. This considerably underestimates the true quantum efficiency but is useful for comparing between devices. Once again, the quantum efficiency of the flexible device was demonstrated not to be affected by repeated bending. The fact thaw there was no appreciable change in either the I-V or L-I characteristics after the device was flexed indicated that the ITO contact, the organic layers, and the alloy top contact were not significantly affected by bending even over a small radius of curvature.

Large-area(~1 cm²) devices were also fabricated by similar methods. As in the case of the smaller devices, the large devices were also be bent over radii of ~0.5 cm without apparent degradation. That these larger areas can be achieved indicates that flexible OLED's can be used in large, roll-up, or conformable flat panel displays. This, in conjunction with the fact that the ITO-precoated substrate is available in large spools, indicates that flexible, OLED-based displays can be mass manufactured on a roll-to-roll basis by use of suitable volume growth technologies such as organic vapor phase deposition.

Failure modes of the large-area device were also studied. If on the convex side of a curved substrate the device can be bent without failure even after a permanent fold occurs in the polyester film. If on the concave side the device remains operational when bent over a radius of curvature down to 0.5 cm. At smaller radii, cracks propagate through the device, and current-shunt paths are created between bottom and top contacts after further bending. When ITO-precoated substrates are similarly bent, the same cracking phenomenon is observed, from which it can be inferred that the cracks occur in the ITO rather than in the OLED itself.

Figure 5:
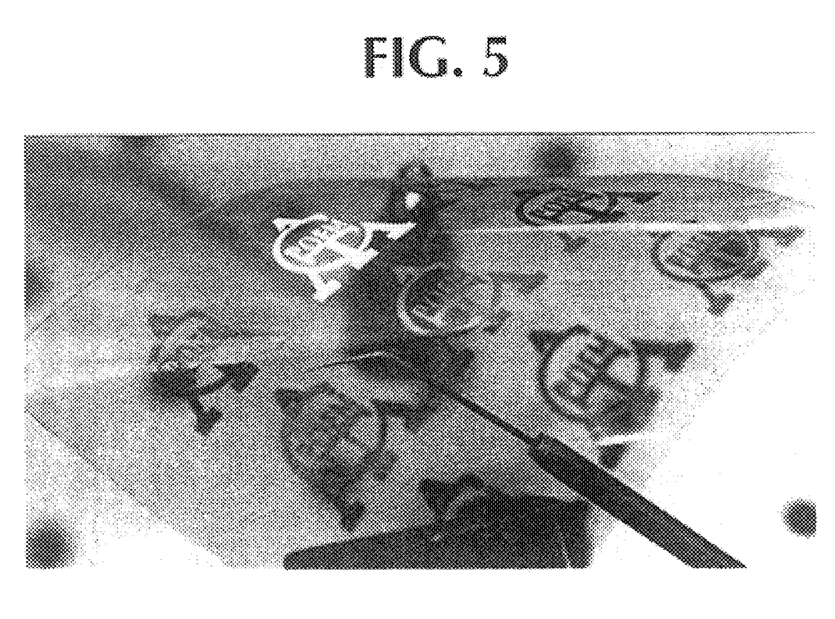
FIG. 5 shows a photograph of an array of nine unpackaged 1 $cm^2$ vacuum-deposited, non-polymeric flexible OLED's. One device in contact with the probe arm is shown operating in air in a well-illuminated room at normal video display brightness (~100 $cd/m^2$).

In conclusion, vacuum-deposited, van der Waals-bonded, non-polymeric flexible OLED's, such as illustrated in FIG. 5, have been fabricated using an ITO-precoated transparent polyester film as the substrate. It has been shown that an ITO thin film, when precoated on a flexible substrate, provides a flat, highly transparent, conductive, flexible contact suitable for OLED applications. This hole-injecting ITO-coated substrate may also be used with OLED's comprising polymeric hole transporting, electron transporting, and/or emissive layers comprised of polymers. In addition, performance similar to that disclosed herein is expected if non-polymeric devices are vacuum deposited on polymeric, transparent hole-injecting contacts such as polyaniline, which may be useful if even greater flexibility is required in certain applications.

Although a particular OLED structure of FIG. 1 has been described, it is to be understood that any OLED structure having layers that are vacuum formed could be formed on a flexible polymeric substrate in accordance with this invention. Those of skill in the art may recognize certain modifications to the various embodiments of the invention, which modifications are meant to be covered by the spirit and scope of the appended claims.

What is claimed is:

1. A method of preparing a flexible organic light emitting device comprising:

providing a flexible substrate coated with an indium tin oxide layer;

fabricating an organic light emitting device on the flexible substrate, wherein fabrication of the organic light emitting device includes the step of vacuum depositing a hole transporting layer comprised of non-polymeric organic material over the indium tin oxide layer; wherein the indium tin oxide layer is sufficiently uniform such that bending of the device does not appreciably change either the current-voltage or the light-current characteristics of the device relative to the current-voltage or light-current characteristics of the device prior to bending.

2. The method according to claim 1 wherein fabrication of the organic light emitting device includes the step of vacuum depositing an electron transporting layer comprised of non-polymeric organic material over the hole transporting layer.

3. The method according to claim 2 wherein fabrication of the organic light emitting device includes the step of depositing a separate emissive layer comprised of non-polymeric organic material over the hole transporting layer prior to vacuum depositing the electron transporting layer over the hole transporting layer.

4. The method of claim 1 wherein the bending occurs to a radius of curvature of about 0.5 cm.

5. A method of preparing a flexible organic light emitting device comprising:

providing a flexible substrate coated with an indium tin oxide layer, wherein the indium tin oxide layer has a surface roughness that does not exceed about 3.6 nm;

fabricating an organic light emitting device on the flexible substrate, wherein fabrication of the organic light emitting device includes the step of vacuum depositing a hole transporting layer comprised of non-polymeric organic material over the indium tin oxide layer.

6. The method according to claim 5 wherein fabrication of the organic light emitting device includes the step of vacuum depositing an electron transporting layer comprised of non-polymeric organic material over the hole transporting layer.

7. The method according to claim 6 wherein fabrication of the organic light emitting device includes the step of depositing a separate emissive layer comprised of non-polymeric organic material over the hole transporting layer prior to vacuum depositing the electron transporting layer over the hole transporting layer.

8. A method of fabricating a flexible organic light emitting device comprising:

providing a flexible substrate coated with an indium tin oxide layer;

depositing a hole transporting layer consisting essentially of non-polymeric organic material over the indium tin oxide layer;

depositing an electron transporting layer consisting essentially of non-polymeric organic material over the hole transporting layer; and depositing a cathode layer over the electron transporting layer; the indium tin oxide layer being sufficiently uniform such that bending of the device does not appreciably change either the current-voltage or the light-current characteristics of the device relative to the current-voltage or light-current characteristics of the device prior to bending.

9. The method according to claim 8 wherein the method includes the step of depositing a separate emissive layer consisting essentially of non-polymeric organic material over the hole transporting layer prior to depositing the electron transporting layer over the hole transporting layer.

10. The method of claim 8 wherein the flexible substrate comprises a polyester substrate.

11. The method of claim 8 wherein bending of the device to a radius of curvature of about 0.5 cm does not appreciably change either the current-voltage or the light-current characteristics of the device relative to the current-voltage or light-current characteristics of the device prior to bending.

12. A method of fabricating a flexible organic light emitting device comprising:

providing a flexible substrate coated with an indium tin oxide layer, wherein the indium tin oxide layer has a surface roughness that does not exceed about 3.6 nm;

depositing a hole transporting layer consisting essentially of non-polymeric organic material over the indium tin oxide layer;

depositing an electron transporting layer consisting essentially of non-polymeric organic material over the hole transporting layer; and depositing a cathode layer over the electron transporting layer.

13. The method according to claim 12 wherein the method includes the step of depositing a separate emissive layer consisting essentially of non-polymeric organic material over the hole transporting layer prior to depositing the electron transporting layer over the hole transporting layer.

14. The method of claim 12 wherein the flexible substrate comprises a polyester substrate.

15. A method of fabricating a flexible organic light emitting device comprising:

providing a flexible polyester substrate coated with an indium tin oxide layer, wherein the indium tin oxide layer has a surface roughness that does not exceed about 3.6 nm;

depositing a layer of N,N'-diphenyl-N,N'-bis(3-methylpheny)1-1'biphenyl-4,4'diamine over the indium tin oxide anode layer;

depositing a layer of tris-(8-hydroxyquinoline) aluminum over the N,N'-diphenyl-N,N'-bis(3-methylpheny)1-1'biphenyl-4,4'diamine layer; and depositing a metal layer over the tris-(8-hydroxyquinoline) aluminum layer.

16. A method of preparing a flexible organic light emitting device comprising:

obtaining a flexible substrate having thereon a layer of indium tin oxide having a surface roughness that does not exceed about 3.6 nm;

depositing a layer of organic small molecule material over the layer of indium tin oxide;

depositing an electrode layer over the layer of organic small molecule material.

17. The method of claim 16 wherein the organic small molecule material is a hole transporting material, and further comprising the step of depositing a layer of organic small molecule electron transporting material over the organic small molecule hole transporting material.

* * * * *